(12) United States Patent
Kibe

(10) Patent No.: US 8,930,793 B2
(45) Date of Patent: Jan. 6, 2015

(54) METHOD OF COMMUNICATING SIGNAL DATA IN GNSS USING LDPC CONVOLUTION CODES AND A SYSTEM THEREOF

(75) Inventor: Suresh Vithal Kibe, Bangalore (IN)

(73) Assignee: Indian Space Research Organisation, Bangalore (IN)

( * ) Notice: Subject to any disclaimer, the term of this patent is extended or adjusted under 35 U.S.C. 154(b) by 0 days.

(21) Appl. No.: 13/392,771

(22) PCT Filed: Aug. 27, 2010

(86) PCT No.: PCT/IN2010/000569
§ 371 (c)(1),
(2), (4) Date: Apr. 19, 2012

(87) PCT Pub. No.: WO2011/024206
PCT Pub. Date: Mar. 3, 2011

(65) Prior Publication Data
US 2012/0198307 A1  Aug. 2, 2012

(30) Foreign Application Priority Data
Aug. 27, 2009 (IN) .......................... 2064/CHE/2009

(51) Int. Cl.
*H03M 13/00* (2006.01)

(52) U.S. Cl.
USPC .......................................... 714/758; 714/752

(58) Field of Classification Search
None
See application file for complete search history.

(56) References Cited

U.S. PATENT DOCUMENTS

| | | | | |
|---|---|---|---|---|
| 2010/0098245 A1* | 4/2010 | Fang et al. | ....................... | 380/38 |
| 2010/0122143 A1* | 5/2010 | Lee et al. | ....................... | 714/752 |
| 2011/0047434 A1* | 2/2011 | Walker et al. | ................. | 714/752 |

OTHER PUBLICATIONS

European Space Agency: "Galileo Open Service Signal in space interface control document (OS SIS ICD)", May 23, 2006, pp. 1-80, XP002617529, retrieved from the Internet on Jan. 19, 2011: http://www.galileoic.org/la/files/Galileo%200S%20SIS%20ICD%20230506.pdf, pp. 13 and 46-50.
Ehm, H., Weigl, R: "Galileo Europe's share for a global navigation satellite service," Jul. 17, 2008, pp. 1-207, XP002617530, retrieved from the Internet: http://www.lte.e-technik.uni-erlangen.de/download/SSUE/ShortCourse_Galileo.pdf, pp. 135-137.

(Continued)

*Primary Examiner* — Guerrier Merant
(74) *Attorney, Agent, or Firm* — D. Peter Hochberg; Sean F. Mellino; Richard A. Wolf

(57) ABSTRACT

A method and system for communicating signal data in GNSS system using LDPC convolution codes. The method involves, at transmitting end, formatting signal data into a set of subframes. Each subframe of the signal data can be encoded in accordance with a parity check matrix defining Tanner graph representation of LDPC convolution codes. The encoded signal data can be interleaved and added with a Sync word field to transmit an interleaved block of encoded signal data through a communication channel. At receiving end, the interleaved block of encoded signal data can be de-interleaved after it is received from the communication channel. The Tanner Graph shows the connectivity in time invariant parity check matrix. A message passing technique is used to decode the LDPCCC encoded message. The encoded signal data can be decoded through the message passing technique to obtain the signal data primitively transmitted at the transmitting end. Such method and system are capable of achieving error free performance over the GNSS communication channel for effective navigation data communication, and also provide good BER performance over a wide range of Signal-to-Noise ratios.

17 Claims, 5 Drawing Sheets

(56) References Cited

OTHER PUBLICATIONS

Chen et al., Zhengang: "Efficient Encoding and Termination of Low-Density Parity-Check Convolution Codes," Proc., IEEE Global Telecommunications Conference, GLOBECOM '06, Nov. 27, 2006, pp. 1-5, XP031462697, ISBN: 978-1-4244-0356-1, pp. 1-3 & 4.

Chen et al., Zhengang: "Low-density parity-check convolution codes applied to packet based communication systems," Proc. IEEE Global Telecommunications Conference, GLOBECOM '05, St. Louis, MO., USA, vol. 3, Nov. 28, 2005-Dec. 2, 2005, pp. 1250-1254, XP010880931, DOI: DOI:10.1109/GLOCOM.2005.1577852, ISBN: 978-0-7803-9414-8, the whole document.

Chen et al., Zhengang: "Efficient Implementation of Low-Density Parity-Check Convolutional Code Encoders With Built-In Termination," IEEE Transactions on Circuits and Systems 1: Regular Papers, IEEE, US, vol. 53, No. 11, Dec. 1, 2008, pp. 3628-3640, XP011239206, ISSN: 1549-328, pp. 3628-3635.

Chen et al., Zhao: "The Usage of Turbo Code in the Signal of Galileo System," Proc. IEEE International Conference on Telecommunication, ITS 207, Jun. 1, 2007, pp. 1-5, XP031130304, DOI: DOI:10.1109/ITST.2007.4295915, ISBN: 978-1-4244-1177-1, the whole document.

* cited by examiner

|← 1500 BITS →|

| SUBFRAME 1 | SUBFRAME 2 | SUBFRAME 3 | SUBFRAME 4 | SUBFRAME 5 |
|---|---|---|---|---|
| 300 BITS | 300 BITS | 300 BITS | 300 BITS | 300 BITS |

(a)

|← 292 BITS →|

| 1 | 07 | 263 | |
|---|---|---|---|
| PAGE | NAVIGATION DATA | CRC | TAILBITS |
| 6 BITS | 256 BITS | 24 BITS | 6 |

(b)

|← 600 BITS →|

| 1 | 17 | 600 |
|---|---|---|
| SYNC | DATA WITH FEC | |
| 16 BITS | 584 BITS with r = 1/2 FEC | |

(c)

Fig. 2

METHOD OF COMMUNICATING SIGNAL DATA IN GNSS USING LDPC CONVOLUTION CODES AND A SYSTEM THEREOF

CROSS-REFERENCE TO RELATED APPLICATIONS

This application is a National Stage application of International Application No. PCT/IN2010/000569, filed on Aug. 27, 2010, which claims priority of Indian patent application number 2064/CHE/2009, filed on Aug. 27, 2009, both of which are incorporated herein by reference in their entireties.

BACKGROUND OF THE INVENTION

1. Field of the Invention

The present invention relates to the field of data communication in satellite communication systems. The present invention specifically relates to a method of communicating signal data in a global navigation satellite system (GNSS) using low density parity check (LDPC) convolution codes and a system thereof under low signal to noise ratio condition.

2. Description of the Prior Art

Communication systems transmit information from one source to another across various communication channels. In particular, satellite communication systems are implemented to provide a basic communication, i.e. space-to-earth communication and space-to-space communication through the communication channels. Initially, the information to be transmitted is encoded at source end. After source coding, channel coding techniques are implemented to the information before transmitting it to the communication channels. The channel coding techniques are used to protect the data from channel noise. These coding techniques are commonly referred as Forward Error Correction (FEC) coding techniques such as Bose-Chaudhuri-Hocquenghem (BCH) codes, Convolutional codes, Turbo Codes and LDPC block codes.

Further, the channel coding techniques are judged based on their ability to approach Shannon's capacity limit, which states that as long as the transmission rate is less than the channel capacity, error free communication can be achieved. Generally, BCH codes, Convolutional codes and Turbo Codes are used for channel coding in many applications. Then, Low Density Parity Check (LDPC) block codes are introduced for achieving higher capacity performance over a variety of channels than other channel coding techniques.

LDPC convolution codes (LDPCCC) are introduced as convolution counterparts of LDPC block codes. LDPCCC is capable of achieving similar capacity approaching performance as LDPC block codes with simple encoding and decoding. In addition, LDPCCC is suitable for continuous as well as block transmission. Moreover, it uses iterative decoding offering excellent Bit Error Rate (BER) performance and is amenable to pipelining VLSI implementation of LDPCCC encoders and decoders is accomplished based on replicating units such as processors. For the same complexity of hardware, LDPCCC outperforms other FEC techniques such as BCH, Convolutional codes, Turbo Codes and LDPC block codes.

Such LDPCCC technique provides very good BER performance with simpler hardware implementation for error free performance over a variety of communication channels. However, so far, there is no application and implementation of the LDPCCC technique for communication of navigation data structures in a conventional medium earth orbit or geostationary orbit satellite navigation system. Further, it is necessary to maintain error free performance over the communication channels even in the communication of navigation data structure while implementing the LDPCCC technique in Global Navigation Satellite System (GNSS). Therefore, it is desirable to provide a method and system of communicating signal data in GNSS system using LDPC convolution codes, which is capable of achieving near error free performance over a GNSS communication channel for effective navigation data communication.

SUMMARY OF THE PRESENT INVENTION

An object of the present invention is to provide a method of communicating signal data in GNSS system using LDPC convolution codes, which is capable of achieving error free performance over a GNSS communication channel for effective navigation data communication.

Another object of the present invention is to provide a system for communicating signal data in GNSS system using LDPC convolution codes, which provides good BER performance over a wide range of Signal-to-Noise ratios with simple hardware implementation.

According to one aspect, the present invention, which achieves this objective, relates to a method of communicating signal data in GNSS system using low density parity check (LDPC) convolution codes, comprising: at transmitting end, formatting signal data into a set of subframes. Each subframe of the signal data can be encoded in accordance with a parity check matrix defining Tanner graph representation of LDPC convolution codes. The encoded signal data can be interleaved and added with a Sync word field to transmit an interleaved block of encoded signal data through a communication channel. At receiving end, the interleaved block of encoded signal data can be de-interleaved after it is received from the communication channel. The Tanner Graph shows the connectivity in time invariant parity check matrix. A message passing technique is used to decode the LDPCCC encoded message. The encoded signal data can be decoded through the message passing technique to obtain the signal data primitively transmitted at the transmitting end. Such method is capable of achieving error free performance over the GNSS communication channel for effective navigation data communication, and also provides good BER performance over a wide range of Signal-to-Noise ratios.

Furthermore, the encoded signal data is block interleaved by writing into a memory matrix either column by column or row by row. The message passing technique for a finite and small number of tailbits in the encoder and decoder which drives the FSM (Finite State Machine) into such a state that a zero input message gives a zero code word. The implementation of LDPCCC enables continuous decoding using pipeline decoders. The interleaved block of encoded signal data is de-interleaved by reading out column by column if the signal data is interleaved row by row and vice versa. The encoded signal data is block interleaved with an interleaving depth in accordance with error correction capability of the LDPC convolution codes.

In addition, the code rate is calculated based on the number of symbol nodes and the number of constraint nodes, where the number of symbol nodes is less than the number of constraint nodes. The number of symbol nodes is configured with a time index associated with the symbol codes. The syndrome former memory comprises a highest power of delay operator in said parity check matrix and index of Galois field. The signal data comprises navigation data structure. Each subframe of the signal data is configured with identity page bits, navigation data bits, cyclic redundancy check (CRC) bits and termination bits. The termination bits depend on an encoded codeword of each subframe excluding the termination bits of the signal data for driving a finite state machine.

According to another aspect, the present invention, which achieves this objective, relates to a system for communicating signal data in GNSS system using low density parity check (LDPC) convolution codes, comprising: at transmitting end, a data formatter in communication with a data source for formatting signal data into a set of subframes. An encoder is in communication with the data formatter for constructing a parity check matrix to define Tanner graph representation of LDPC convolution codes to encode each subframe of the signal data. An interleaver is associated with the encoder for carrying out block interleaving and addition of a sync word field on the encoded signal data. A transmitter is associated with the interleaver for transmitting an interleaved block of encoded signal data through a communication channel. At receiving end, a de-interleaver is in communication with a receiver for de-interleaving the interleaved block of encoded signal data received from the receiver through the communication channel. A decoder in communication with said de-interleaver for decoding the encoded signal data through a message passing technique to obtain the signal data primitively transmitted at the transmitting end.

A further understanding of the nature and the advantages of particular embodiments disclosed herein may be realized by reference of the remaining portions of the specification and the attached drawings.

BRIEF DESCRIPTION OF THE DRAWINGS

The invention will be discussed in greater detail with reference to the accompanying Figures.

FIG. 2a illustrates a typical navigation data structure for a GNSS system, in accordance with an exemplary embodiment of the present invention;

FIG. 2b illustrates a detailed view of a subframe of the navigation data structure of FIG. 1a, in accordance with an exemplary embodiment of the present invention;

FIG. 2c illustrates forward error correction (FEC) on the subframes of the navigation data structure of FIG. 2a, in accordance with an exemplary embodiment of the present invention;

DETAILED DESCRIPTION OF THE INVENTION

Global Navigation Satellite Systems (GNSS) are implemented in the frequency bands 1559-1610 MHz (L1 signal), 1215-1300 MHz (L2 signal) and 1164-1215 MHz (L5 signal). The signal and data structure for each of these GNSS systems are different. The present invention describes implementation of LDPC Convolution Codes (LDPCCC) for signal and data structure in the GNSS systems, in particular medium earth orbit or geostationary orbit satellite navigation system. The LDPCCC implementation is configured with data rates ranging from 25 bits/sec to 500 bits/sec and Forward Error Correction (FEC) codes from rate ½, k=7 convolution code to Low Density Parity Check (LDPC) codes for various signals.

Further, the LDPCCC provides a systematic comparison of the codes for finite block lengths. The LDPCCC is capable of achieving Shannon capacity approaching performance with iterative decoding. The LDPCCC provides encoding simplicity through shift register based systematic real time encoding of the navigation data structure. Moreover, the LDPCCC implementation also provides the excellent bit error rate performance in the presence of Additive White Gaussian Noise (AWGN) and for a Binary Symmetrical Channel (BSC). Thus, the LDPCCC facilitates better performance than the LDPC block codes even under very low Energy per Bit to Noise Density ratios (Eb/No) conditions.

Figure 1:
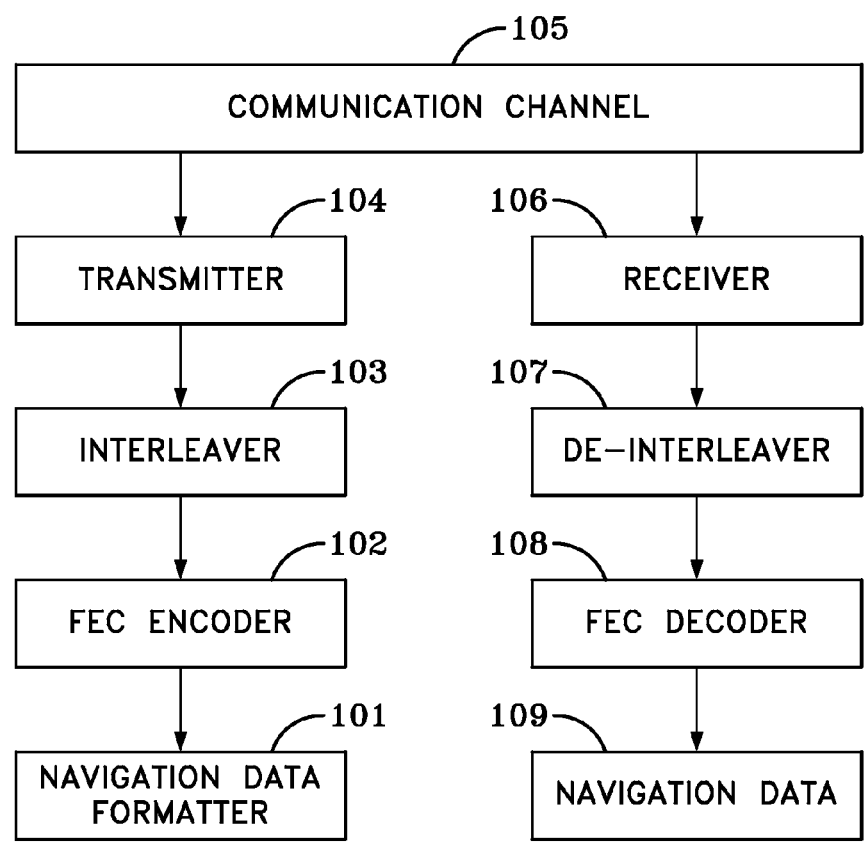
FIG. 1 illustrates a schematic block diagram of a system for communicating signal data in GNSS system using LDPC convolution codes, in accordance with an exemplary embodiment of the present invention.

Referring to FIG. 1, a schematic block diagram of a system for communicating signal data in GNSS system using LDPC convolution codes is illustrated, in accordance with an exemplary embodiment of the present invention. The communication system can be configured with a transmitting section, a receiving section and a communication channel 105. The transmitting section is arranged with a navigation data formatter 101, a forward error correction (FEC) encoder 102, an interleaver 103 and a transmitter 104, whereas the receiving section is arranged with a receiver 106, a de-interleaver 107 and a FEC decoder 108.

In both transmission and reception, encoding and decoding of navigation data message 109 can be implemented by means of LDPC convolution codes. Hereafter, the FEC encoder 102 and decoder 108 can be referred as LDPCCC encoder and decoder only for the purpose of explanation. The communication channel 105 includes, but not limited to satellite, optical fibre, landline and copper cable. In case if the navigation data message 109 is to be received back at the transmission section, then the LDPCCC encoder 102 and decoder 108 are coupled together at the transmission section. On the other hand, if the transmitting and receiving sections are positioned at different places, then the LDPCCC encoder 102 and decoder 108 are placed at the transmitting and receiving sections, respectively. Such LDPCCC encoder 102 and decoder 108 are necessary for data communication for low Eb/No. Usually, FEC is required when the Eb/No is below 6.5 dB.

In the transmitting section, raw navigation signal data 109 can initially be formatted into a set of subframes using the navigation data formatter 101, as shown in FIG. 2a, which illustrates a typical navigation data structure for a GNSS system, in accordance with an exemplary embodiment of the present invention. The navigation data formatter 101 is in communication with a data source having the navigation data 109. The navigation data structure 109 for the GNSS system containing 1500 bits can be formatted into subframes 1 to 5, where each subframe contains 300 bits. The present invention explained with a specific measure is only for understanding proposes, not by the way of limitations. Each subframe 1 to 5 of the navigation data structure 109 is configured with a set of fields, like page, navigation data, cyclic redundancy check (CRC) and tailbits, as shown in FIG. 2b, which illustrates a detailed view of a subframe of the navigation data structure 109 of FIG. 1a, in accordance with an exemplary embodiment of the present invention. Each subframe 1 to 5 (292 bits) can be identified by a page (6 bits) followed by navigation data (256 bits), CRC (24 bits) and tailbits (6 bits) as per forward error correction (FEC). For example, the conventional r=½, k=7 convolution codes requires 6 tail bits to flush out the memory.

Then, the LDPCCC encoder 102 is in communication with the navigation data formatter 101 to encode the navigation data structure 109 by means of forward error correction (FEC). In FEC, the convolutional code doubles the number of navigational data bits from 300 to 600 with rate ½, k=7, as shown in FIG. 2c, which illustrates FEC on the subframes of the navigation data structure 109 of FIG. 2a, in accordance with an exemplary embodiment of the present invention. After performing FEC encoding into the subframe, each subframe is encoded to obtain the navigation data with FEC (292×2=584 bits with r=½ FEC). Then, the FEC encoded subframe is interleaved and added with a Sync word field (16 bits). The encoder 102 and decoder 108 can normally be a Viterbi maximum likelihood encoder and decoder. The size of the memory is 6 and hence the tail bits are also 6. This convolutional code improves Eb/No performance by about 5 dB with soft decision encoding and decoding. For the limited number of navigation data bits in the typical GNSS system, the encoding of LDPC convolutional codes with rate ½ can be performed in the navigational data, which outperforms the conventional rate=½, k=7 convolutional code as well as the LDPC block codes. The number of termination bits, i.e. tail-bits, required for j=3, k=6 in the LDPC convolutional code with rate=½, ms–5 (syndrome former memory) appear to be constant and numerically equal to 6. The value of termination bits depends on the encoded codeword of the navigation data frame excluding termination bits. The termination bits drive the FSM (finite state machine) into such a state that zero input message gives a zero codeword. The number of termination bits increases with ms and is greater than or equal to ms. Also, the number of termination bits can be a multiple of j, i.e. 3 in this example, which can further be adjusted to optimize the code performance. The LDPC convolutional codes are suitable for practical implementation in a number of different communication scenarios, including continuous transmission as well as block transmission in frames of arbitrary size. Also, each subframe explained in FIG. 2 contains a set of tail bits which drives the FSM to initial state, promising more efficient coding than convolutional codes or LDPC-block codes.

The VLSI implementation of the encoder 102 and decoder 108 is facilitated due to the LDPC convolutional structure of the Tanner graph. For a given complexity, the LDPC convolutional codes provide better BER performance than other codes as shown in the FIG. 3 at a given Eb/No. In Tanner graph representation, the LDPCCC encoding matrix (H) consists of only a few 1's in any row or column, where the remaining elements in the LDPCCC encoding matrix are zero. The number of 1's in any column of the LDPCCC encoding matrix is denoted by j and the number of 1's in any row is denoted by k. The rate of the code is r=1–j/k. The Tanner graph of the LDPC convolution code is similar to the Tanner graph of the block code. The symbol nodes corresponding to each row and constraint nodes corresponding to each column of the syndrome former $H^T$ are represented on a Tanner graph. A line called an edge connects the symbol node to a constraint node if the entry in the corresponding row and column of $H^T$ is "1". There is one to one correspondence between a Syndrome former and its Tanner graph. The syndrome former matrix for $m_s$=3, j=2 and k=3 is given below, $$H^T(D) = \begin{bmatrix} 1 & D^3 \\ D & D^2 \\ D^3 & 1 \end{bmatrix} \quad (2.5)$$

where the symbol D stands for delay operator.

In the implementation of encoding matrix for the LDPCCC encoder 102, j is a number of symbol nodes, i.e. the number of rows of the parity check matrix, k is a number of constraint nodes, i.e. the number of columns of the parity, check matrix, and $m_s$ is a syndrome former memory, i.e. the highest power of D in the parity check matrix. The syndrome former memory (m) is the index of the Galois field, which is always a prime number like m=7.31, etc. Further, rate of the code (R) can be formulated as, $$R = 1 - \frac{j}{k}, \text{ where } j < k$$

In the implementation of encoding matrix, two values a and b are also defined as o(a)=j and o(b)=k, where O(x) is the order of x in Galois field m, such that $x^{o(x)}$ modulo m is 1, for example O(2)=6, m=7.

Accordingly, the continuous Tanner graph of the LDPC convolutional code is shown below, Since the convolutional code is infinite, the Tanner graph of the LDPC convolutional code is also infinite, which makes the LDPC convolutional code different from the block code. The code symbols of the LDPC convolutional code contain a time index associated with the code symbols. The LDPC convolutional codes are not limited to a fixed block length (N) as LDPC block codes, i.e. a single code can be utilized for several block lengths, where N is the length of data in the typical LDPC block code. The complexity of encoding of the LDPC convolution code is low using shift registers. The LDPC convolutional codes also achieve continuous decoding using pipeline decoders.

For a given complexity, the LDPC convolutional codes provide better performance than the LDPC block codes. The connectivity of nodes in the Tanner graph structure at different times is identical for a time invariant convolutional code, which leads to significant reduction in storage requirement for implementing these LDPCCC codes. The time invariant LDPCCC codes can be algebraically constructed using quasi-cyclic LDPC codes. A code is quasi cyclic if for any cyclic shift of a code word by p places the resulting word is also a code word.

After performing LDPCCC encoding, the block Interleaving and addition of sync word is performed on the encoded navigation data using the interleaver 103 in order to make the channel robust towards burst errors. The encoded navigation data can be interleaved before transmitting the navigation data to the communication channel 105. If the burst errors occur in the encoded navigation data, then the burst errors can effectively determined as distributed errors after de-interleaving of the navigation data. This type of burst errors can be corrected by the LDPCCC decoder 108. The interleaver 103 and de-interleaver 107 are in communication with the LDPCCC encoder 102 and decoder 108, respectively. In order to perform block interleaving on the navigation data, the bits of the navigation data are written into an n×k memory matrix having n columns and k rows. The navigation data is written either column by column or row by row to obtain the interleaved block and read in the reverse manner. Then, the transmitter 104 is associated with the interleaver 103 for transmitting the interleaved navigation data through the communication channel 105.

Similarly, in the receiving section, the receiver 106 is associated with the de-interleaver 107 for de-interleaving the interleaved block of encoded navigation data received from the communication channel 105. The bits of interleaved block of the encoded navigation data are written into the memory matrix row by row and read out column by column to obtain the de-interleaved navigation data at the receiving section. For example, the block interleaving of 8×73 is possible for the encoded navigation data as shown in FIG. 2c. The value of k can usually be referred as interleaving depth and selected according to the error correction capability of code. If the convolution code utilizes a constraint length of 7, single bit errors in each block equal can be corrected to the constraint length. In this scenario, the interleaving depth can be selected to be a minimum of 7.

Further, the LDPCCC decoder 108 is in communication with the de-interleaver 107 for decoding the encoded navigation data after de-interleaving the received navigation data, in order to obtain the navigation data 109 primitively transmitted at the transmitting section. The LDPCCC decoder 108 can be implemented by calculating r for each constraint node using the formula given below, $$r_{ij} = c_i + \sum_{j' \in N(i)/j} q_{j'i}$$

where, r is the message sent from the symbol node to the constraint node.

$c_i$ is the Log Likelihood Ratio (LLR) of the given encoded bit that is fed to the symbol node.

j' is all the neighboring nodes of i leaving j.

Also, q for each symbol node can be calculated using the formula given below, $$q_{ji} = \log \frac{1 + \prod_{i' \in N(j)/i} \tanh(r_{i'j}/2)}{1 - \prod_{i' \in N(j)/i} \tanh(r_{i'j}/2)}$$

where, q is the message sent from the constraint node to the symbol node.

$r_{ij}$ is the value for all r's from the constraint node that it is connected to except when i=j.

$q_{ji}$ calculates cumulative probability of the message from the constraint node satisfying the parity check equation.

$r_{ij}$ calculates the total probability of the symbol node being the bit satisfying the parity check equation.

Figure 3:
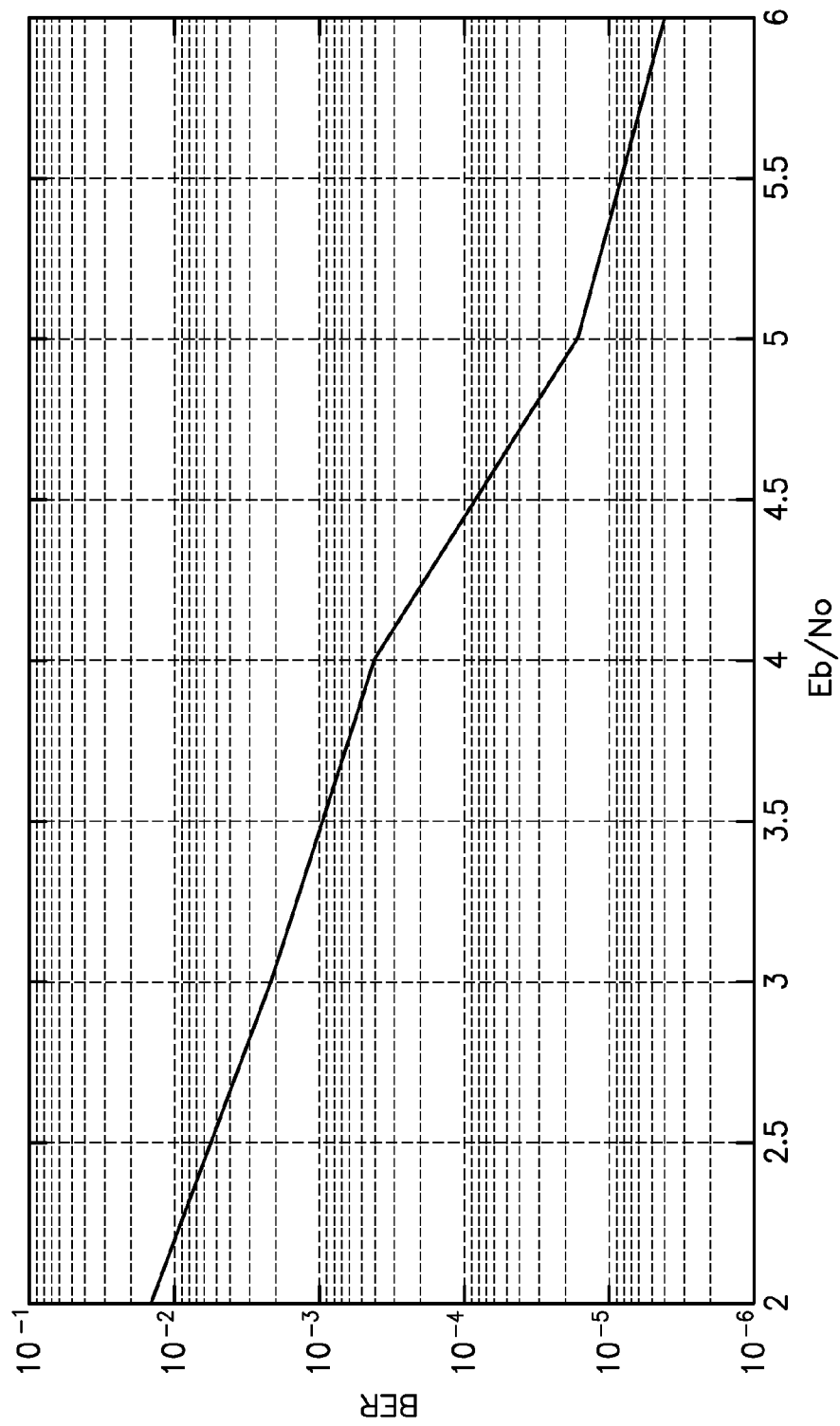
FIG. 3 illustrates a typical example of BER performance in the navigation data structure for the GNSS system, in accordance with an exemplary embodiment of the present invention.

Further, the LLR can be represented by $$LLR = \log \frac{p_0}{p_1},$$

where $p_i$ is the probability of the bit taking the value i, The LLR can also be represented as LLR=$c_i$+$\Sigma q_{ji}$. If LLR>0, then the decoded bit is 0 whereas if LLR<0, then the decoded bit is 1. The nominal value of LLR can be considered as 16. In the present invention, the LDPCCC encoder 102 and decoder 108 can be implemented and developed with r=½, m=7, $m_s$=5 by considering j=3, k=6. The BER performance of LDPCCC measured with BSC and AWGN after introducing AWGN noise in rate half LDPCCC is shown in FIGS. 2a & 2b, where the number of iterations is generally taken as 10. The observation of BER performance of LDPCCC for a limited length N in the typical navigational data for GNSS system is clearly stated in the Table 1 and a graph as shown in FIG. 3, which illustrates a typical example of BER performance in the navigation data structure 109 for the GNSS system. The BER performance shown in Table 1 is carried out with the number of iterations equal to 35.

| Sl. No. | Loops | Eb/No (dB) | No. of errors | BER |
|---|---|---|---|---|
| 1 | 9 000 | 7 | No error | — |
| 2 | 6 000 | 6 | 7 | $4.05 \times 10^{-6}$ |
| 3 | 1 500 | 5 | 7 | $1.62 \times 10^{-5}$ |
| 4 | 1 000 | 4 | 114 | $3.96 \times 10^{-4}$ |
| 5 | 500 | 3 | 297 | $2.06 \times 10^{-3}$ |
| 6 | 100 | 2 | 330 | $1.14 \times 10^{-2}$ |

It is noted that the Energy per Bit to Noise Density ratios (Eb/No) required at BER=$10^{-5}$ has 0.5 dB better performance than an equivalent Viterbi decoder for small frame lengths. Such algorithm can be further modified to improve the BER performance in the navigation data structure 109 for the GNSS system. The LDPCCC encoder 102 and decoder 108 can be implemented using VC++ software.

The LDPCCC algorithm is developed with j=3, k=6 and $m_s$=5. The LDPCCC code is an ingenious algorithm with complexity about $1/15^{th}$ of an equivalent algorithm using LDPC code. The processor complexity of the LDPCCC is 6 whereas the processor complexity of the LDPC code is 194 for similar length j=3 and k=6. The decoding delay for this LDPCCC algorithm is 3.7 seconds whereas the decoding delay of the LDPC code is more than 11.5 seconds. The LDPCCC algorithm is easily modifiable by changing the initially defined variables. The number of lines of C-code is 260, which is the lowest possible in implementing of the LDPCCC algorithm. The number of tail-bits in this LDPCCC algorithm is 6. The LDPCCC algorithm determines the value of the six termination bits, which depend on the encoded codeword of the frame excluding termination bits. The finite and small number of tail bits helps in simple and speedier implementation of the LDPCCC encoder and decoder algorithm. The termination bits drive the finite state machine (FSM) into such a state that zero input message provides a zero codeword.

In addition, the LDPC convolution codes are simple to encode, since the original code construction yields to a shift register based systematic encoding. The LDPC convolution codes are suitable for transmission of continuous data as well as block transmissions in frames of arbitrary size whereas the LDPC transmits block of fixed length only. For a given complexity, the LDPC convolution codes have better performance than the LDPC block codes. The LDPCCC codes provide excellent BER performance under AWGN, and are extremely useful for large values of data bits N. Also, it can be used with good BER performance for shorter number of data symbols in GNSS navigation data. The architecture of the LDPCCC codes is more amenable to pipelining because of feed forward architecture, which facilitates higher clock speeds and continuous decoding. VLSI implementation of LDPCCC codes is based on replicating identical units called processors. A complete decoder can be constructed by concatenating a number of processors together, where the convolutional structure of Tanner graph aids VLSI implementation.

Moreover, for comparable BER performance, the size of LDPCCC processor is an order of magnitude less than LDPC block code. The routing complexity within a processor is also an order of magnitude less than the LDPC block code. Hence, the LDPCCC facilitates very good BER performance with simpler hardware implementation, and is utilized for error free performance over a variety of communication channels, especially in the navigation data structures, which require good BER performance over a wide range of Signal-to-Noise ratios commonly represented by Energy per Bit to Noise Density ratios (Eb/No). The LDPCCC technique is suitable for computer-to-computer communication, satellite communication links, large file transfers over terrestrial, cable, optical fibre links or global navigation satellite system (GNSS) links.

Figure 4:
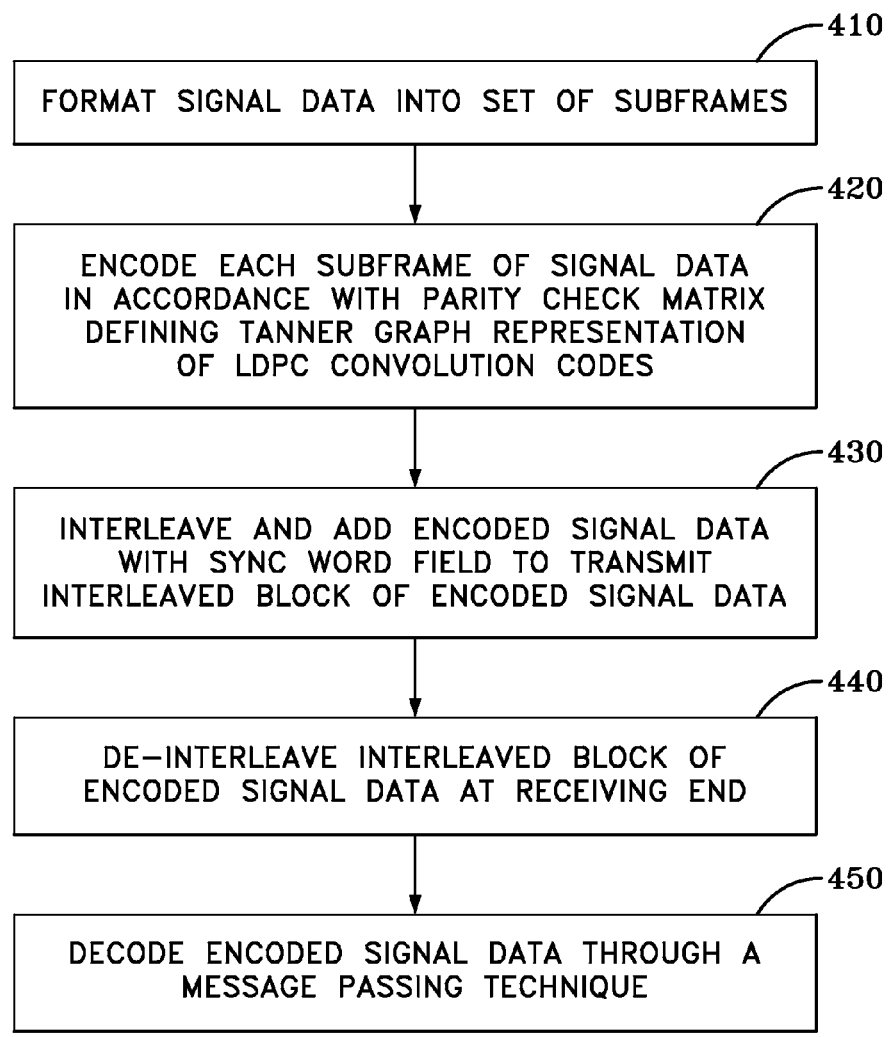
FIG. 4 illustrates a flowchart of a method of communicating signal data in GNSS system using LDPC convolution codes, in accordance with an exemplary embodiment of the present invention.
Figure 5:
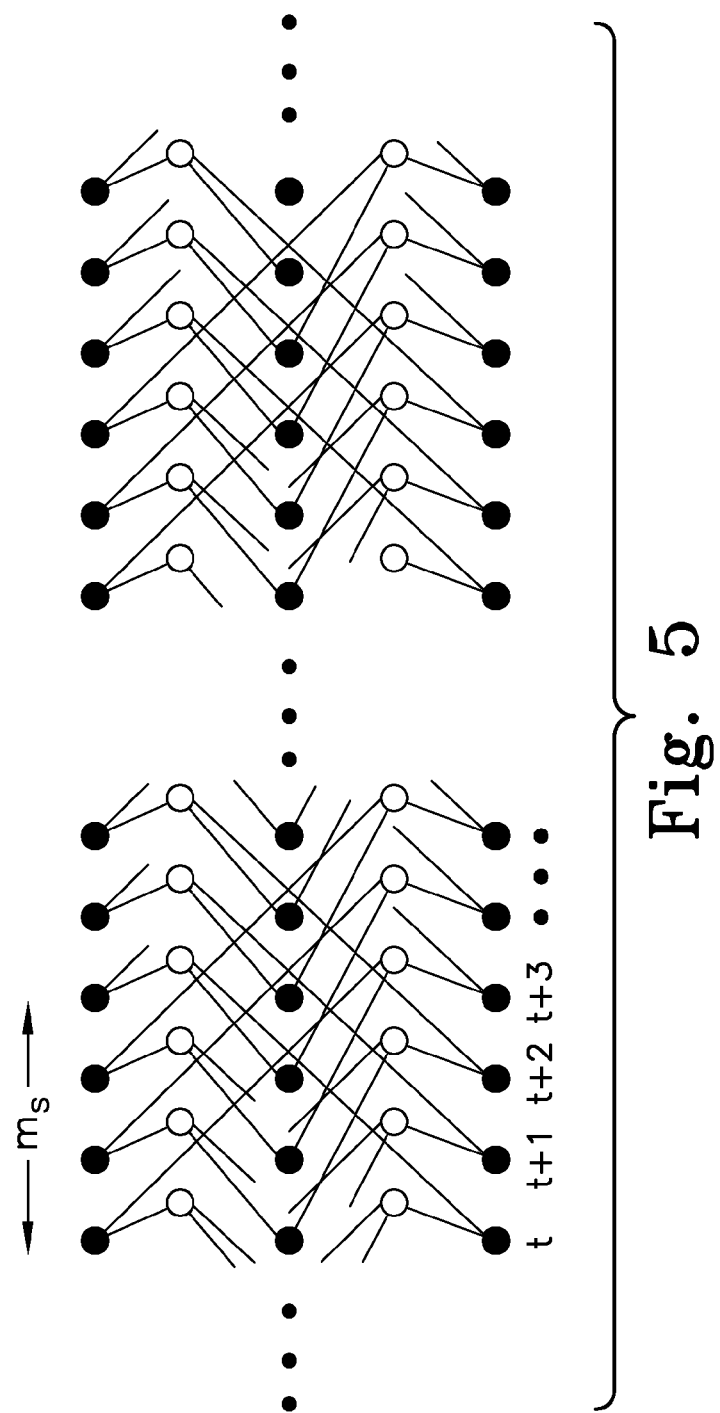
FIG. 5 illustrates a continuous Tanner graph of the LDPC convolutional code, in accordance with an exemplary embodiment of the present invention.

Referring to FIG. 4, a flowchart of a method of communicating signal data in GNSS system using LDPC convolution codes is illustrated, in accordance with an exemplary embodiment of the present invention. As specified in step 410, navigation signal data 109 to be transmitted, can be formatted into a set of subframes at transmitting end. Each subframe of the signal data is configured with identity page bits, navigation data bits, cyclic redundancy check (CRC) bits and termination bits. The termination bits depend on an encoded codeword of each subframe excluding the termination bits of the signal data for driving a finite state machine. As indicated in step 420, each subframe of the navigation signal data can be encoded in accordance with a parity check matrix defined by a Tanner graph representation of the LDPC convolution codes. The parity check matrix can be defined by a number of symbol nodes, a number of constraint nodes, a code rate and a syndrome former memory. The number of symbol nodes is a number of rows of the parity check matrix whereas the number of constraint nodes is a number of columns of the parity check matrix.

Further, the number of symbol nodes can be configured with a time index associated with the symbol codes. The syndrome former memory is a highest power of delay operator in the parity check matrix and index of Galois field. The code rate can be calculated based on the number of symbol nodes and the number of constraint nodes, where the number of symbol nodes is less than the number of constraint nodes. Then, as depicted in step 430, the encoded signal data can be interleaved and added with a Sync word field to transmit an interleaved block of encoded signal data through a communication channel. The encoded signal data can be block interleaved by writing into a memory matrix either column by column or row by row. The interleaved block of encoded signal data can be de-interleaved by reading out column by column if the signal data is interleaved row by row and vice versa. The encoded signal data can be block interleaved with an interleaving depth in accordance with error correction capability of the LDPC convolution codes.

Thereafter, as specified at step 440, at receiving end, the interleaved block of encoded signal data can be de-interleaved after receiving it from the communication channel. Finally, as depicted in step 450, the encoded signal data can be decoded based on a message passing technique to obtain the navigation signal data 109 primitively transmitted at the transmitting end. Such method is capable of achieving error free performance over the GNSS communication channel for effective navigation data communication, and also provides good BER performance over a wide range of Eb/No ratios.

The LDPC convolutional codes are capable of achieving Shannon capacity approaching performance with iterative decoding. Moreover, the LDPCCC implementation also provides the excellent bit error rate performance in the presence of Additive White Gaussian Noise (AWGN) and for a Binary Symmetrical Channel (BSC). Thus, the LDPCCC facilitates better performance than the LDPC block codes. LDPC convolutional codes are suitable for practical implementation in a number of different communication scenarios, including continuous transmission as well as block transmission in frames of arbitrary size. Also, each subframe explained in FIG. 2 contains a set of tail bits which drives the FSM to initial state, promising more efficient coding than convolutional codes or LDPC-block codes.

Computational complexity for LDPC convolutional codes is very less as compared to LDPC block codes for same iterations and same frame length. Processor Complexity of LDPC convolutional codes is as compared to LDPC block codes per iteration. Decoding delay for LDPC convolutional codes is negligible as compared to for LDPC block codes. Memory requirement for LDPC convolutional codes is much less as compared to that for LDPC block codes. Termination bits are fixed in number and are equal to 6 in the configuration described. Thus, ending the long held problem of variable length termination of the frame.

Although the description has been described with respect to particular embodiments thereof, these particular embodiments are merely illustrative, and not restrictive. Any suitable programming language can be used to implement the routines of particular embodiments including C, C++, Java, assembly language, etc. Different programming techniques can be employed such as procedural or object oriented. The routines can execute on a single processing device or multiple processors. Although the steps, operations, or computations may be presented in a specific order, this order may be changed in different particular embodiments. In some particular embodiments, multiple steps shown as sequential in this specification can be performed at the same time.

Particular embodiments may be implemented in a computer-readable storage medium for use by or in connection with the instruction execution system, apparatus, system, or device. Particular embodiments can be implemented in the form of control logic in software or hardware or a combination of both. The control logic, when executed by one or more processors, may be operable to perform that which is described in particular embodiments.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What has been described above are preferred aspects of the present invention. It is of course not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, combinations, modifications, and variations that fall within the spirit and scope of the appended claims.

I claim:

1. A method of communicating signal data in a GNSS system using low density parity check (LDPC) convolution codes and message passing algorithm for achieving near error free performance over a GNSS system for effective navigation data communication and good BER performance over a wide range of Eb/No ratios, said method comprising the steps of:

at a transmitting end, formatting signal data into a plurality of subframes;

encoding each subframe of the signal data in accordance with a parity check matrix defined by a Tanner graph representation of LDPC convolution codes;

interleaving and adding the encoded signal data with a Sync word field to transmit an interleaved block of encoded signal data through a communication channel to form block codes;

at a receiving end, de-interleaving the interleaved block of encoded signal data after receiving said interleaved block of encoded signal data from said communication channel;

configuring each subframe of the signal data with bits selected from the group consisting of identity page bits, navigation data bits, cyclic redundancy check (CRC) bits and termination bits;

wherein the termination bits depend on an encoded codeword of each subframe excluding the termination bits of the signal data for driving a finite state machine and wherein the number of termination bits increases with ms and is greater than or equal to ms; and decoding the encoded signal data through a message passing technique defined on the Tanner graph representation to obtain the signal data primitively transmitted at the transmitting end, wherein the LDPC convolution codes and block codes are different.

2. The method according to claim 1, further comprising the step of block interleaving the encoded signal data by writing into a memory matrix either column by column or row by row.

3. The method according to claim 1, further comprising the step of driving FSM (Finite State Machine) into such a state that a zero input message gives a zero code word by a unique coding technique for a finite and small number of tailbits in encoder and decoder.

4. The method according to claim 1, wherein the implementation of LDPC convolution codes enables continuous decoding using pipeline decoders.

5. The method according to claim 1, further comprising the step of de-interleaving the interleaved block of encoded signal data by reading out column by column if the signal data is interleaved row by row and vice versa.

6. The method according to claim 1, wherein the encoded signal data is block interleaved with an interleaving depth in accordance with error correction capability of the LDPC convolution codes.

7. The method according to claim 1, wherein said parity check matrix is defined by a number of symbol nodes, a number of constraint nodes, a code rate and a syndrome former memory.

8. The method according to claim 7, wherein the number of symbol nodes comprises a number of rows of said parity check matrix and wherein the number of constraint nodes comprises a number of columns of said parity check matrix.

9. The method according to claim 7, wherein the code rate is calculated based on the number of symbol nodes and the number of constraint nodes, where the number of symbol nodes is less than the number of constraint nodes.

10. The method according to claim 7, wherein the number of symbol nodes is configured with a time index associated with the symbol codes.

11. The method according to claim 7, wherein the syndrome former memory comprises a highest power of delay operator in said parity check matrix and index of Galois field.

12. The method according to claim 1, wherein the signal data comprises navigation data structure.

13. The method according to claim 1, wherein the parity check matrix is defined as log likelihood ratio (LLR) of the encoded signal data.

14. A system for communicating signal data in a GNSS system using low density parity check (LDPC) convolution codes, comprising:

at a transmitting end, a data formatter in communication with a data source for formatting signal data into a plurality of subframes;

at least one encoder in communication with said data formatter for constructing a parity check matrix to define Tanner graph representation of LDPC convolution codes to encode each subframe of the signal data and to encode the navigation data structure by forward error correction (FEC);

at least one interleaver associated with said encoder for carrying out block interleaving and addition of a sync word field on the encoded signal data;

at least one transmitter associated with said interleaver for transmitting an interleaved block of encoded signal data through a communication chapmel;

at a receiving end, a de-interleaver in communication with a receiver for de-interleaving the interleaved block of encoded signal data received from said receiver through said communication channel;

configuring each subframe of the signal data with bits selected from the group consisting of identity page bits, navigation data bits, cyclic redundancy check (CRC) bits and termination bits;

wherein the termination bits depend on an encoded codeword of each subframe excluding the termination bits of the signal data for driving a finite state machine and wherein the number of termination bits increases with ms and is greater than or equal to ms; and at least one decoder in communication with said de-interleaver for decoding the encoded signal data through a message passing technique to obtain the signal data primitively transmitted at the transmitting end.

15. The system according to claim 14, wherein the communication channel comprises one selected from the group consisting of a satellite, optical fibre, a landline and copper cable.

16. The system according to claim 1, further comprising an LDPCCC processor being an order of magnitude less than LDPC block code and wherein a routing complexity within said processor is an order of magnitude less than the LDPC block code.

17. A method of communicating signal data in a GNSS system using low density parity check (LDPC) convolution codes and message passing algorithm for achieving near error free performance over a GNSS system for effective navigation data communication and good BER performance over a wide range of Eb/No ratios, said method comprising the steps of:

at a transmitting end, formatting signal data into a plurality of subframes;

encoding each subframe of the signal data in accordance with a parity check matrix defined by a Tanner graph representation of LDPC convolution codes; interleaving and adding the encoded signal data with a Sync word field to transmit an interleaved block of encoded signal data through a communication channel to form block codes;

at a receiving end, de-interleaving the interleaved block of encoded signal data after receiving said interleaved block of encoded signal data from said communication channel;

configuring each subframe of the signal data with bits selected from the group consisting of identity page bits, navigation data bits, cyclic redundancy check (CRC) bits and termination bits;

wherein the termination bits depend on an encoded codeword of each subframe excluding the termination bits of the signal data for driving a finite state machine and wherein the number of termination bits increases with ms and is greater than or equal to ms;

decoding the encoded signal data through a message passing technique defined on the Tanner graph representation to obtain the signal data primitively transmitted at the transmitting end; and configuring each subframe of the signal data with bits selected from the group consisting of identity page bits, navigation data bits, cyclic redundancy check (CRC) bits and termination bits, wherein the termination bits depend on an encoded codeword of each subframe excluding the termination bits of the signal data for driving a finite state machine.

* * * * *